(12) United States Patent
Lee

(10) Patent No.: US 9,431,087 B2
(45) Date of Patent: Aug. 30, 2016

(54) MULTI-CHANNEL SELF REFRESH DEVICE

(71) Applicant: SK hynix Inc., Icheon-si, Gyeonggi-do (KR)

(72) Inventor: Sang Hoon Lee, Seoul (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/683,967

(22) Filed: Apr. 10, 2015

(65) Prior Publication Data

US 2016/0180919 A1    Jun. 23, 2016

(30) Foreign Application Priority Data

Dec. 18, 2014 (KR) .................. 10-2014-0183246

(51) Int. Cl.
*G11C 7/00* (2006.01)
*G11C 11/406* (2006.01)

(52) U.S. Cl.
CPC ........ *G11C 11/40615* (2013.01); *G11C 11/406* (2013.01); *G11C 11/40611* (2013.01); *G11C 11/40618* (2013.01); *G11C 11/40626* (2013.01)

(58) Field of Classification Search
CPC .......... G11C 11/406; G11C 11/40615; G11C 11/40626; G11C 11/40611; G11C 11/40618
USPC ......................................... 365/222; 711/106
See application file for complete search history.

(56) References Cited

U.S. PATENT DOCUMENTS

| 7,268,377 | B2* | 9/2007 | Ieong | .............. H01L 21/823807 257/255 |
| 8,675,436 | B2 | 3/2014 | Kim et al. | |
| 2005/0052919 | A1* | 3/2005 | Chou | .................... G11C 11/406 365/222 |
| 2007/0022245 | A1* | 1/2007 | Sohn | .................. G06F 13/1636 711/106 |
| 2007/0121407 | A1* | 5/2007 | Lee | ........................ G11C 11/406 365/222 |
| 2011/0193086 | A1 | 8/2011 | Lee et al. | |
| 2012/0263003 | A1* | 10/2012 | Sakakibara | ....... G11C 11/40615 365/222 |
| 2013/0028034 | A1* | 1/2013 | Fujisawa | ........... G11C 11/40615 365/194 |
| 2014/0177360 | A1* | 6/2014 | Jang | .................. G11C 11/40615 365/194 |
| 2014/0189215 | A1* | 7/2014 | Kang | ................. G11C 11/40603 711/103 |
| 2014/0233332 | A1* | 8/2014 | Jeon | .................. G11C 11/40611 365/191 |
| 2015/0162068 | A1* | 6/2015 | Woo | .................. G11C 11/40615 365/222 |

\* cited by examiner

*Primary Examiner* — Toan Le
(74) *Attorney, Agent, or Firm* — William Park & Associates Ltd.

(57) ABSTRACT

A multi-channel self refresh device may include period generation circuit configured to output a self refresh pulse signal having a predetermined time period in response to a refresh enable signal. The multi-channel self refresh device may include a channel region configured to activate a refresh signal in response to the self refresh pulse signal, when a self refresh command signal corresponding to a channel from among a plurality of self refresh command signals is activated.

19 Claims, 6 Drawing Sheets

MULTI-CHANNEL SELF REFRESH DEVICE

CROSS-REFERENCE TO RELATED APPLICATION

This application claims priority based upon Korean patent application No. 10-2014-0183246, filed on Dec. 18, 2014, the disclosure of which is hereby incorporated in its entirety by reference herein.

BACKGROUND

1. Technical Field

Embodiments of the present disclosure generally relate to a multi-channel self-refresh device, and more particularly to a technology relating to defects generated by a self-refresh operation of a multi-channel semiconductor device.

2. Related Art

A memory cell of a dynamic semiconductor memory such as a dynamic random access memory (DRAM) stores data within a capacitive element. Due to charges leaking from the capacitive element, the memory cell must be periodically refreshed. The refresh process performs the read operation for restoring a level of charges stored in the memory cell to an original state.

Different types of refresh methods have been developed. Generally, the auto refresh method is configured to use a refresh timer located outside of a memory chip, such that the memory chip can perform the refresh operation in response to a periodic refresh command from a controller. The self refresh method is configured to use a refresh timer located outside of the memory chip, such that all the memory chips are configured to request a refresh start command from the controller.

Typically, it is impossible for the refreshed memory cell to access the normal read and write operations. After the lapse of a predetermined time upon completion of one refresh operation, an active cycle may start an operation. In this case, the predetermined time is generally denoted by a refresh row cycle time (tRFC).

On the other hand, as the demand for higher-speed and higher-integration semiconductor memory devices is continuously increasing, the semiconductor memory devices have rapidly evolved into a multi-bank semiconductor memory device, a multi-chip semiconductor memory device, etc. in various ways.

Recently, the multi-channel semiconductor memory device has been proposed. The multi-channel semiconductor memory device provides a large bandwidth and is highly integrated. The multi-channel semiconductor memory device includes a plurality of memories in a single chip. Each memory includes an input/output (I/O) pad so that it can be operated as a separate memory device. That is, each memory of the multi-channel semiconductor memory device may operate as an independent memory device for independently inputting/outputting an address, a command, and/or data.

So that each channel can be independently operated, each channel for use in the multi-channel semiconductor memory device receives a command and an address separately from each other. For example, one channel performs refreshing, and at the same time the other channel performs writing. Therefore, respective banks allocated to each channel are sequentially refreshed at intervals of a predetermined time within the tRFC time.

A plurality of channels for use in the multi-channel semiconductor memory device may share one Temperature Compensated Self Refresh (TCSR) periodic pulse generator. The TCSR periodic pulse generator is a circuit to compensate for the self refresh period in response to a temperature.

However, although the multi-channel product is fabricated in a single chip, all channels contained in the multi-channel product can be operated independently from each other. Therefore, it is impossible for one TCSR periodic pulse generator to control two or more channels in the same manner as in "one-chip-one-channel product".

In order to address the above-mentioned issues, if the TCSR periodic pulse generator is assigned to each channel, the area size and consumption current of each channel are unavoidably increased. In addition, all the TCSR periodic pulse generators must be targeted, resulting in an increased time consumed for product testing.

In addition, assuming that a self refresh command signal is asynchronously input to a plurality of channels, Pulse for Self Refresh (PSRF) may be enabled as soon as the self refresh command signal is input. In this case, one or more defective or failed cells may occur in a circuit operation of the refresh operation mode.

SUMMARY

In accordance with an embodiment, a multi-channel self refresh device may include a period generation circuit configured to output a self refresh pulse signal having a predetermined time period in response to a refresh enable signal. The multi-channel self refresh device may include a channel region configured to activate a refresh signal in response to the self refresh pulse signal, when a self refresh command signal corresponding to a channel from among a plurality of self refresh command signals is activated.

In accordance with an embodiment, a multi-channel self refresh device may include a combination unit configured to output a refresh enable signal in response to receiving at least one self refresh signal from a plurality of self refresh signals. The multi-channel self refresh device may include a period generation circuit configured to output a self refresh pulse signal having a predetermined time period in response to the refresh enable signal. The multi-channel self refresh device may include a first Pulse for Self Refresh (PSRF) controller configured to output a first refresh signal in response to the self refresh pulse signal when a first self refresh command signal is activated. The multi-channel self refresh device may include a second PSRF controller configured to output a second refresh signal in response to the self refresh pulse signal when a second self refresh command signal is activated.

DETAILED DESCRIPTION

Reference will now be made to various embodiments of the present disclosure, examples of which are illustrated in the accompanying drawings. Wherever possible, the same reference numbers are used throughout the drawings to refer to the same or like portions. In the following description of the present disclosure, a detailed description of related known configurations or functions incorporated herein may be omitted for clarity of the subject matter.

Various embodiments of the present disclosure may be directed to providing a multi-channel self refresh device substantially obviating one or more problems due to limitations or disadvantages of the related art.

Embodiments of the present disclosure may relate to a multi-channel self refresh device configured to control a self refresh pulse during a test mode for use in a structure. The structure including several channels sharing one TCSR periodic pulse generator.

Figure 1:
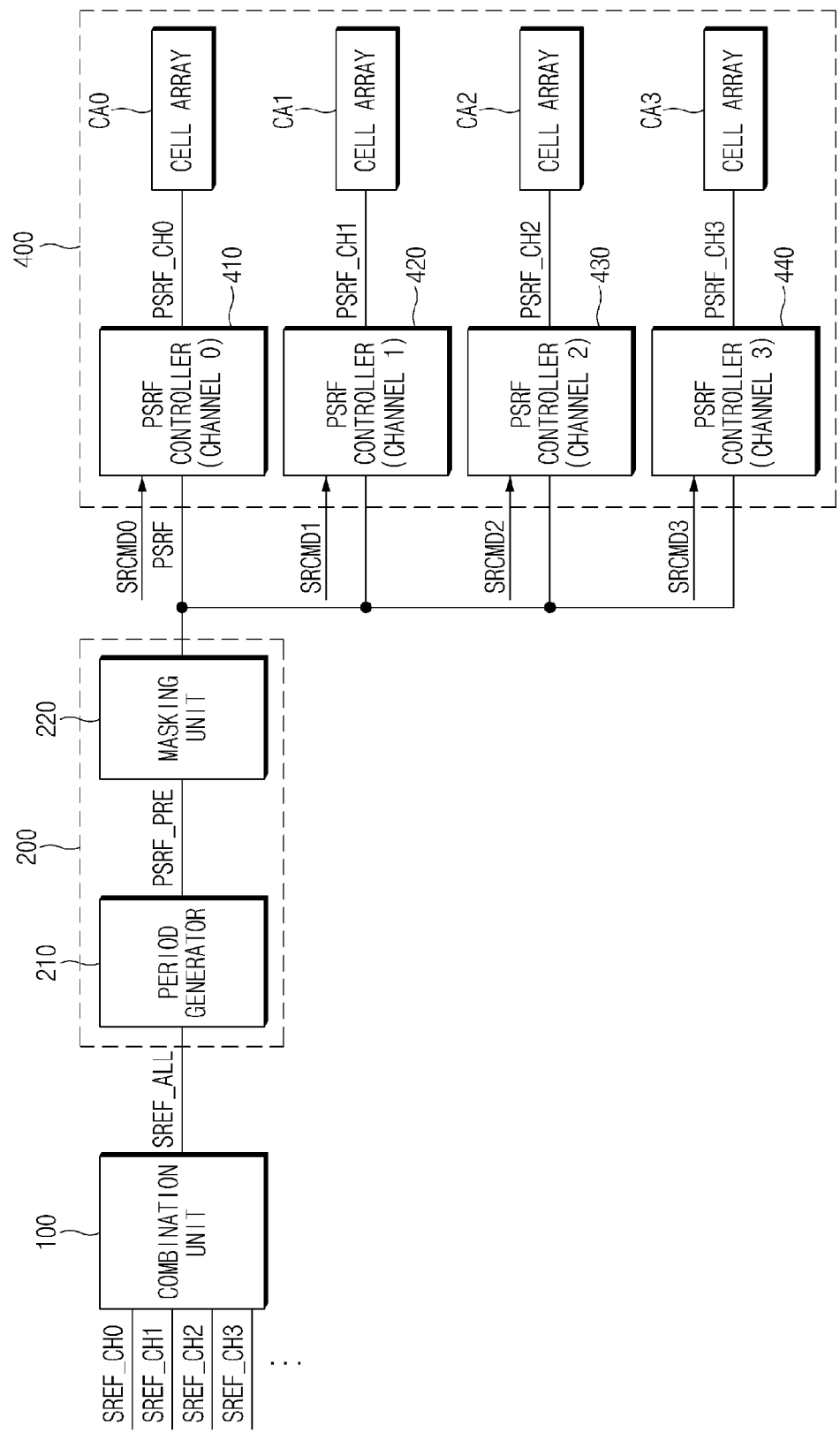
FIG. 1 is a block diagram illustrating an example of a representation of a multi-channel self refresh device according to an embodiment.

FIG. 1 is a block diagram illustrating an example of a representation of a multi-channel self refresh device according to an embodiment.

Referring to FIG. 1, the multi-channel self refresh device may include a combination unit 100, a period generation circuit 200, and a channel region 400. For example, the period generation circuit 200 may include a period generator 210 and a masking unit 220. The channel region 400 may include a plurality of Pulse for Self Refresh (PSRF) controllers (410, 420, 430, 440) and a plurality of cell arrays (CA0~CA3).

The combination unit 100 may combine self refresh signals (SREF_CH0, SREF_CH1, SREF_CH2, SREF_CH3) corresponding to respective channels to output a refresh enable signal (SREF_ALL).

For example, the combination unit 100 may include an OR logic unit. If at least one of the self refresh signals (SREF_CH0, SREF_CH1, SREF_CH2, SREF_CH3) applied to respective channels is activated (or at a predetermined level), the refresh enable signal (SREF_ALL) is enabled (or at a predetermined level). For example, the self refresh signals (SREF_CH0, SREF_CH1, SREF_CH2, SREF_CH3) may transition from a low level to a high level during a self refresh mode.

The period generation circuit 200 may generate a self refresh pulse signal (PSRF). The period generation circuit 200 may generate the self refresh pulse signal (PSRF) in response to a refresh enable signal (SREF_ALL).

The period generator 210 of the period generation circuit 200 may generate a refresh period. The period generator 210 of the period generation circuit 200 may generate the refresh period in response to the refresh enable signal (SREF_ALL), and may generate a period signal (PSRF_PRE). For example, if the refresh enable signal (SREF_ALL) is activated, the period signal (PSRF_PRE) is activated and generated.

For example, the period generator 210 may include a Temperature Compensated Self Refresh (TCSR) period generation circuit. The TCSR period generation circuit may compensate for the self refresh period in response to a temperature.

The masking unit 220 may output the self refresh pulse signal (PSRF). The masking unit 220 may output the self refresh pulse signal (PSRF) in response to the period signal (PSRF_PRE). The masking unit 220 may mask the period signal (PSRF_PRE) during a specific time period starting from a specific time a pulse of the period signal (PSRF_PRE) is activated and input, and may deactivate the pulse signal (PSRF) and output the deactivated pulse signal (PSRF).

Figure 2:
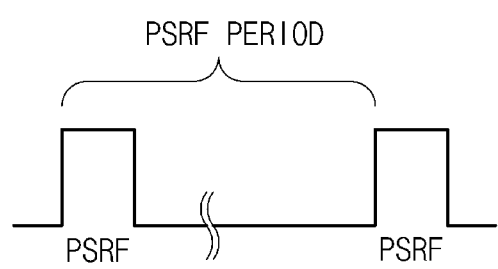
FIG. 2 is a conceptual diagram illustrating an example of a representation of a PSRF period illustrated in FIG. 1.

FIG. 2 illustrates the PSRF period from an input time of the period signal (PSRF_PRE) to an input time of the next period signal (PSRF_PRE). The PSRF period may indicate a pulse width ranging from the rising edge of a first period signal (PSRF_PRE) to the rising edge of a second period signal (PSRF_PRE).

For example, after lapse of a specific time (about 200 ns) from a pulse input time of the period signal (PSRF_PRE), the masking unit 220 may screen a time period in which a pulse of the next period signal (PSRF_PRE) is input. That is, if one period signal (PSRF_PRE) is input and the next period signal (PSRF_PRE) is then input within a specific time, the masking unit 220 may mask the period signal (PSRF_PRE).

The masking unit 220 may output a single common self refresh pulse signal (PSRF) to a plurality of PSRF controllers (410, 420, 430, 440). The masking unit 220 may be shared by a plurality of channels so that the masking unit 220 can control pulse signals of the plurality of channels (i.e., Channel 0, Channel 1, Channel 2, Channel 3, etc.) using only one self refresh pulse signal (PSRF).

For example, channel region 400 may respectively output refresh signals (PSRF_CH0~PSRF_CH3) to respective cell arrays (CA0~CA3) for self-refreshing in response to the self refresh command signals (SRCMD0~SRCMD3) and the self refresh pulse signal (PSRF). In this example, the channel region 400 may include a plurality of PSRF controllers (410, 420, 430, 440) so as to respectively output the refresh signals (PSRF_CH0~PSRF_CH3) to the cell arrays (CA0~CA3).

The PSRF controllers (410, 420, 430, 440) may be contained in the channels, respectively. The PSRF controllers (410, 420, 430, 440) may be associated with the channels, respectively. The PSRF controller 410 may be contained in Channel 0, the PSRF controller 420 may be contained in Channel 1, the PSRF controller 430 may be contained in Channel 2, and the PSRF controller 440 may be contained in Channel 3. The PSRF controller 410 may be associated with Channel 0, the PSRF controller 420 may be associated with Channel 1, the PSRF controller 430 may be associated with Channel 2, and the PSRF controller 440 may be associated with Channel 3.

The PSRF controllers (410, 420, 430, 440) may perform the row refresh counting operation. The PSRF controllers (410, 420, 430, 440) may perform the row refresh counting operation in response to the self refresh pulse signal (PSRF) to generate the refresh signals (PSRF_CH0~PSRF_CH3). The PSRF controllers (410, 420, 430, 440) may operate in response to a single self refresh pulse signal (PSRF) received from the masking unit 220.

For example, the PSRF controllers (410, 420, 430, 440) may activate the refresh signals (PSRF_CH0~PSRF_CH3). The PSRF controllers (410, 420, 430, 440) may activate the refresh signals (PSRF_CH0~PSRF_CH3) in response to the self refresh command signals (SRCMD0~SRCMD3).

For example, only when the self refresh command signal (SRCMD0) is activated, the PSRF controller 410 may activate the refresh signal (PSRF_CH0) in response to the self refresh pulse signal (PSRF). Only when the self refresh command signal (SRCMD1) is activated, the PSRF controller 420 may activate the refresh signal (PSRF_CH1) in response to the self refresh pulse signal (PSRF).

Only when the self refresh command signal (SRCMD2) is activated, the PSRF controller 430 may activate the refresh signal (PSRF_CH2) in response to the self refresh pulse signal (PSRF). Only when the self refresh command signal (SRCMD3) is activated, the PSRF controller 440 may activate the refresh signal (PSRF_CH3) in response to the self refresh pulse signal (PSRF).

If the self refresh command signals (SRCMD0~SRCMD3) are activated, the PSRF controllers may perform the refresh operation at intervals of a predetermined time in response to a cell data retention time of the cell arrays (CA0~CA3) upon receiving the self refresh pulse signal (PSRF).

Figure 3:
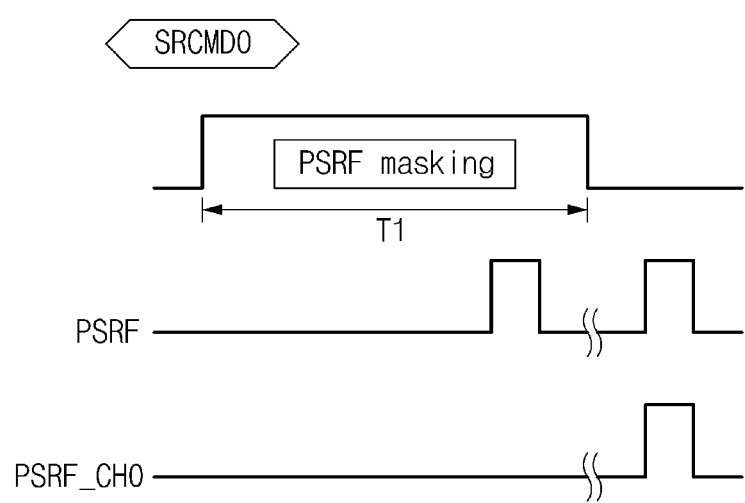
FIG. 3 is a conceptual diagram illustrating an example of a representation of the a PSRF masking operation illustrated in FIG. 1.

FIG. 3 is a conceptual diagram illustrating an example of a representation of the PSRF masking operation of the PSRF controllers (410, 420, 430, 440) illustrated in FIG. 1.

After the PSRF controllers (410, 420, 430, 440) enter the self refresh mode due to activation of the self refresh command signals (SRCMD0~SRCMD3), the PSRF controllers (410, 420, 430, 440) may screen a time period ranging from the self refresh mode start time to the input time of the self refresh pulse signal (PSRF).

For example, the PSRF controllers (410, 420, 430, 440) may screen the self refresh pulse signal (PSRF) during a specific time T1 (e.g., about 200ns) starting from an activation start time of the self refresh command signals (SRCMD0~SRCMD3).

For example, if the PSRF controllers (410, 420, 430, 440) receive the self refresh pulse signal (PSRF) within a specific time T1 after reception of the self refresh command signals (SRCMD0~SRCMD3), the PSRF controllers (410, 420, 430, 440) may mask the self refresh pulse signal (PSRF).

If the self refresh pulse signal (PSRF) is input to the PSRF controllers (410, 420, 430, 440) during the specific time T1, the PSRF controllers (410, 420, 430, 440) may discard the self refresh pulse signal (PSRF) and maintain the refresh signals (PSRF_CH0~PSRF_CH3) in a deactivation state. Thereafter, after lapse of the specific time T1, the refresh signals (PSRF_CH0~PSRF_CH3) are activated in response to the self refresh pulse signal (PSRF).

Therefore, the self refresh pulse signal (PSRF) may be screened during a predetermined time, in these examples a malfunction encountered by glitch may be removed and the stable operation characteristics may be guaranteed.

The various embodiments have disclosed examples whereby the semiconductor device includes 4 channels for one chip for convenience of description and better understanding of the present disclosure. However, the scope or spirit of the present embodiments are not limited thereto, and the number of channels may be changed or varied as necessary.

Figure 4:
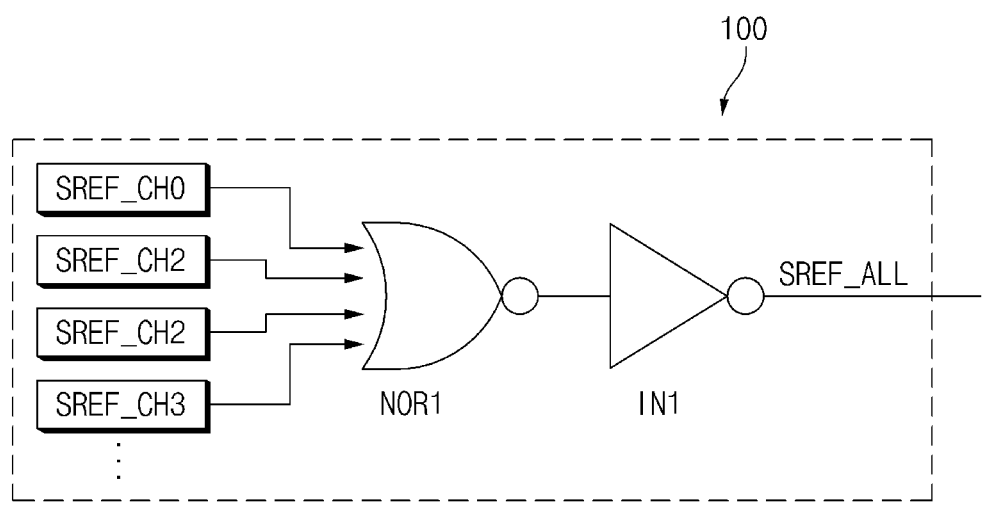
FIG. 4 is a detailed circuit diagram illustrating an example of a representation of the a combination unit illustrated in FIG. 1.

FIG. 4 is a detailed circuit diagram illustrating an example of a representation of the combination unit 100 illustrated in FIG. 1.

Referring to FIG. 4, the combination unit 100 may combine the self refresh signals (SREF_CH0, SREF_CH1, SREF_CH2, SREF_CH3) corresponding to respective channels, so that the combination unit 100 may output the refresh enable signal (SREF_ALL).

The combination unit 100 may include a NOR gate (NOR1) and an inverter (IV1) or equivalents thereof. In this example, the NOR gate (NOR1) may perform a NOR operation among the self refresh signals (SREF_CH0, SREF_CH1, SREF_CH2, SREF_CH3), and output the NOR operation result. The inverter (IV1) may invert the output signal of the NOR gate (NOR1) to activate the refresh enable signal (SREF_ALL).

If at least one of the self refresh signals (SREF_CH0, SREF_CH1, SREF_CH2, SREF_CH3) is activated to a high level, the combination unit 100 may activate the refresh enable signal (SREF_ALL) to a high level.

Figure 5:
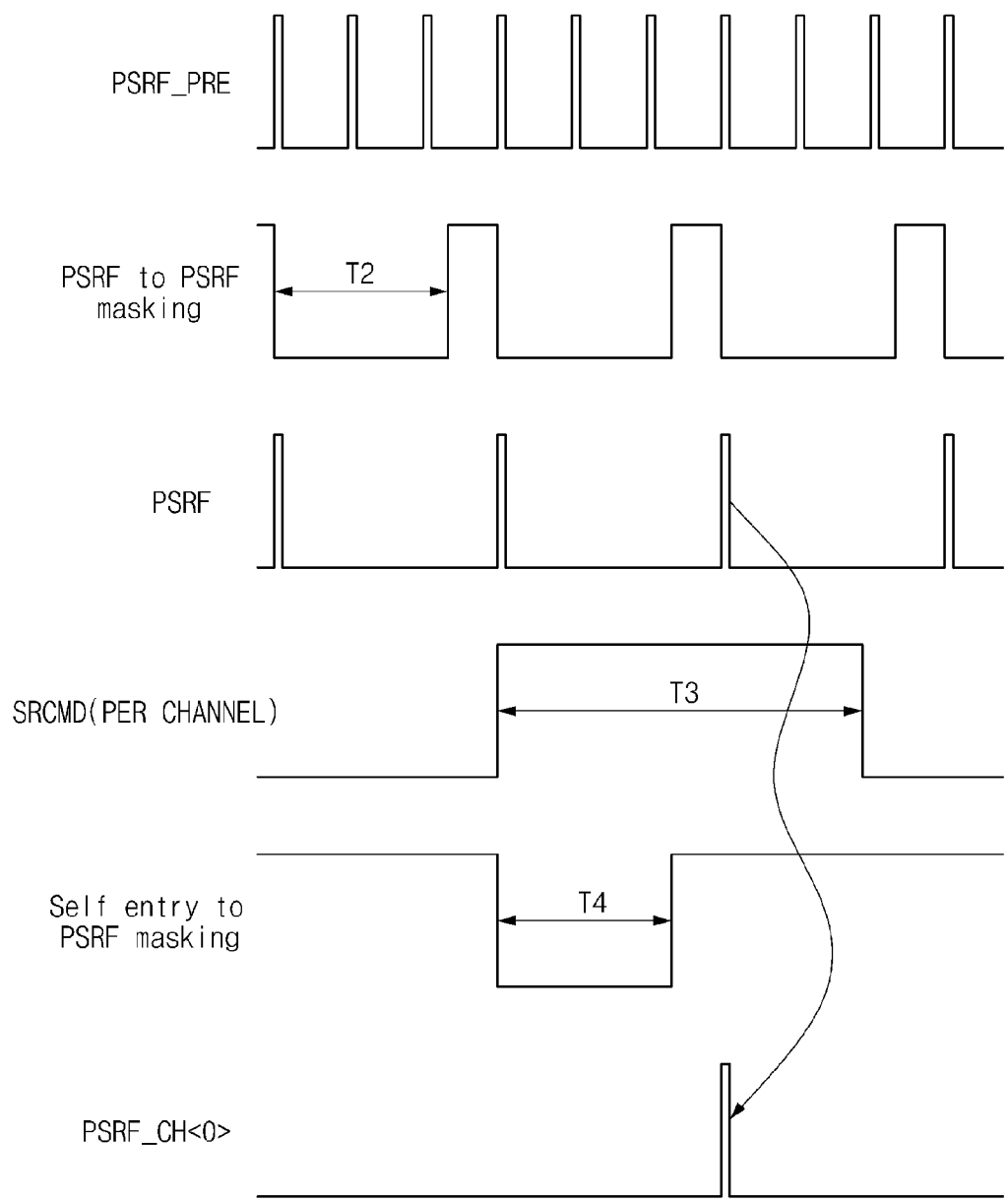
FIG. 5 is a timing diagram illustrating an example of a representation of the operations of the multi-channel self refresh device according to an embodiment.

FIG. 5 is a timing diagram illustrating an example of a representation of the operations of the multi-channel self refresh device according to an embodiment.

Referring to FIG. 5, the period generator 210 may generate a period signal (PSRF_PRE) having a predetermined time period. If the masking unit 220 receives the next period signal (PSRF_PRE) within a specific time T2 after reception of a first period signal (PSRF_PRE), the masking unit 220 may mask the next period signal (PSRF_PRE). Therefore, although the masking unit 220 receives the period signal (PSRF_PRE), the masking unit 220 discards the received period signal (PSRF_PRE), and maintains a low level state during the time period T2.

The masking unit 220 may be synchronized with the falling edge of the period signal (PSRF_PRE), resulting in formation of the self refresh pulse signal (PSRF).

Thereafter, the self refresh command signals (SRCMD0~SRCMD3) are activated to a high level during a time period T3. Upon receiving the self refresh command signals (SRCMD0~SRCMD3) in the time period T3, the PSRF controllers (410, 420, 430, 440) may mask the self refresh pulse signal (PSRF) during a specific time period T4.

Thereafter, the PSRF controllers (410, 420, 430, 440) may output the self refresh signals (SREF_CH0, SREF_CH1, SREF_CH2, SREF_CH3) in response to the self refresh pulse signal (PSRF) upon completion of the time period T4.

Although the various embodiments have disclosed implementing four channels for convenience of description and better understanding of the present disclosure, the scope or spirit of the present disclosure is not limited thereto, and the embodiments can also be applied to other devices, for example, a device having 8 channels or devices having 8 or more channels. In addition, the embodiments of the present disclosure may be applied to a multi-channel stacked chip structure such as, for example, but not limited to a WIO2.

As is apparent from the above description, the embodiments may prevent the occurrence of defective cells generated when a self refresh command is asynchronously applied to a multi-channel self refresh device during a test mode.

Figure 6:
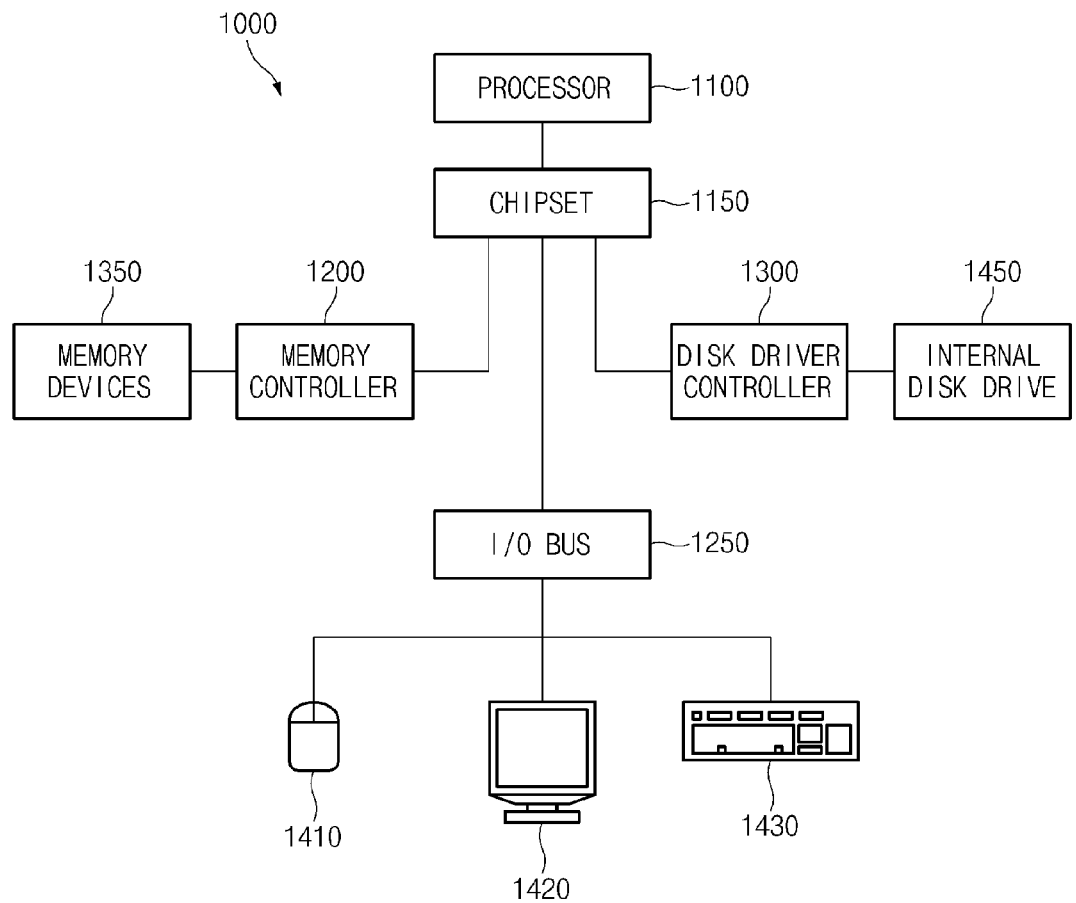
FIG. 6 illustrates a block diagram of an example of a representation of a system employing the multi-channel self refresh device in accordance with the embodiments discussed above with relation to FIGS. 1-5.

The multi-channel self refresh device discussed above (see FIGS. 1-5) is particular useful in the design of memory devices, processors, and computer systems. For example, referring to FIG. 6, a block diagram of a system employing the multi-channel self refresh device in accordance with the embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one multi-channel self refresh device as discussed above with reference to FIGS. 1-5. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one multi-channel self refresh device as discussed above with relation to FIGS. 1-5, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 6 is merely one example of a system employing the multi-channel self refresh device as discussed above with relation to FIGS. 1-5. In alternate embodiments, such as cellular phones or digital cameras, the components may differ from the embodiments illustrated in FIG. 6.

Those skilled in the art will appreciate that the embodiments may be carried out in other specific ways than those set forth herein without departing from the spirit and essential characteristics of the embodiments. The above embodiments are therefore to be construed in all aspects as illustrative and not restrictive.

Although a number of illustrative embodiments have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings and the accompanying claims. In addition to variations and modifications in the component parts and/or arrangements, alternative uses will also be apparent to those skilled in the art.

What is claimed is:

1. A multi-channel self refresh device comprising:
   a period generation circuit configured to output a self refresh pulse signal having a predetermined time period in response to a refresh enable signal;
   a channel region configured to activate a refresh signal in response to the self refresh pulse signal, when a self refresh command signal corresponding to a channel from among a plurality of self refresh command signals is activated;
   a combination unit configured to receive a plurality of self refresh signals and output a refresh enable signal.

2. The multi-channel self refresh device according to claim 1, wherein the combination unit activates and outputs the refresh enable signal when at least one of the plurality of self refresh signals is activated.

3. The multi-channel self refresh device according to claim 1, wherein the combination unit is configured to perform an OR logic operation on the plurality of self refresh signals received by the combination unit.

4. The multi-channel self refresh device according to claim 1, wherein the combination unit includes a NOR logic gate configured to receive the self refresh signals and an inverter configured to receive the output of the NOR logic gate and output the refresh enable signal.

5. The multi-channel self refresh device according to claim 1, wherein the period generation circuit includes:
   a period generator configured to generate a period signal in response to the refresh enable signal; and
   a masking unit configured to output the self refresh pulse signal by masking the period signal during a specific time period.

6. The multi-channel self refresh device according to claim 5, wherein the period generator includes a Temperature Compensated Self Refresh (TCSR) period generation circuit.

7. The multi-channel self refresh device according to claim 5, wherein the masking unit masks the period signal during the specific time period starting from an input time of a first period signal, deactivates the self refresh pulse signal, and outputs the deactivated self refresh pulse signal.

8. The multi-channel self refresh device according to claim 1, wherein the channel region includes a plurality of controllers for receiving a plurality of channels, respectively, each of the plurality of controllers including a Pulse for Self Refresh (PSRF) controller.

9. The multi-channel self refresh device according to claim 8, wherein the channel region includes:
   a first PSRF controller configured to output a first refresh signal in response to the self refresh pulse signal when a first self refresh command signal is activated; and
   a second PSRF controller configured to output a second refresh signal in response to the self refresh pulse signal when a second self refresh command signal is activated.

10. The multi-channel self refresh device according to claim 9, wherein the channel region further includes:
    a first cell array coupled to the first PSRF controller and configured for receiving the first refresh signal from the first PSRF controller; and
    a second cell array coupled to the second PSRF controller and configured for receiving the second refresh signal from the second PSRF controller,
    wherein the first PSRF controller activates the first refresh signal at intervals of a predetermined time in response to a cell data retention time of the first cell array in response to receiving the self refresh pulse signal, and wherein the second PSFR controller activates the second refresh signal at intervals of a predetermined time in response to a cell data retention time of the second cell array in response to receiving the self refresh pulse signal.

11. The multi-channel self refresh device according to claim 1, wherein the channel region, when the plurality of self refresh command signals is activated, masks the self refresh pulse signal during a specific time period, deactivates the refresh signal, and outputs the deactivated refresh signal.

12. A multi-channel self refresh device comprising:
   a combination unit configured to output a refresh enable signal in response to receiving at least one self refresh signal from a plurality of self refresh signals;
   a period generation circuit configured to output a self refresh pulse signal having a predetermined time period in response to the refresh enable signal;
   a first Pulse for Self Refresh (PSRF) controller configured to output a first refresh signal in response to the self refresh pulse signal when a first self refresh command signal is activated; and
   a second PSRF controller configured to output a second refresh signal in response to the self refresh pulse signal when a second self refresh command signal is activated.

13. The multi-channel self refresh device according to claim 12, wherein the combination unit activates and outputs the refresh enable signal when at least one of the plurality of self refresh signals is activated.

14. The multi-channel self refresh device according to claim 12, wherein the period generation circuit includes:
   a period generator configured to generate a period signal in response to the refresh enable signal; and
   a masking unit configured to output the self refresh pulse signal by masking the period signal during a specific time period.

15. The multi-channel self refresh device according to claim 14, wherein the period generator includes a Temperature Compensated Self Refresh (TCSR) period generation circuit.

16. The multi-channel self refresh device according to claim 14, wherein the masking unit masks the period signal during the specific time period starting from an input time of a first period signal, deactivates the self refresh pulse signal, and outputs the deactivated self refresh pulse signal.

17. The multi-channel self refresh device according to claim 12, wherein the first PSRF controller, when the first self refresh command signal is activated, masks the self refresh pulse signal during a specific time period, deactivates the first refresh signal, and outputs the deactivated first refresh signal.

18. The multi-channel self refresh device according to claim 12, wherein the second PSRF controller, when the second self refresh command signal is activated, masks the self refresh pulse signal during a specific time period, deactivates the second refresh signal, and outputs the deactivated second refresh signal.

19. The multi-channel self refresh device according to claim 12, wherein the first PSRF controller is associated with a first channel, wherein the second PSRF controller is associated with a second channel.

* * * * *